United States Patent [19]

Kume et al.

[11] Patent Number: 4,633,438

[45] Date of Patent: Dec. 30, 1986

[54] STACKED SEMICONDUCTOR MEMORY

[75] Inventors: Hitoshi Kume, Musashino; Takaaki Hagiwara, Nishitama; Masatada Horiuchi, Koganei; Toru Kaga, Urawa; Yasuo Igura, Kokubunji; Akihiro Shimizu, Mitaka, all of Japan

[73] Assignees: Hitachi, Ltd.; Hitachi Micro Computer Engineering Ltd., both of Tokyo, Japan

[21] Appl. No.: 681,027

[22] Filed: Dec. 13, 1984

[30] Foreign Application Priority Data

Dec. 19, 1983 [JP] Japan ................... 58-237776

[51] Int. Cl.[4] ........................................... G11C 11/40
[52] U.S. Cl. ...................... 365/51; 365/182; 365/187; 307/304; 357/23.7
[58] Field of Search ............ 365/187, 182, 51; 307/304; 357/23.7

[56] References Cited

U.S. PATENT DOCUMENTS 4,084,108 4/1978 Fujimoto ................ 365/187

FOREIGN PATENT DOCUMENTS 56-83075 7/1981 Japan ................... 357/23.7

OTHER PUBLICATIONS

Abbott et al., "A 4K MOS Dynamic Random-Access Memory", IEEE Journal of Solid-State Circuits, vol. SC-8, No. 5, Oct. 1973, pp. 292-298.

Primary Examiner—Terrell W. Fears
Attorney, Agent, or Firm—Antonelli, Terry & Wands

[57] ABSTRACT

In a 3-transistor random access memory for dynamic operation, the invention discloses a structure in which one of the transistors is stacked on the other transistor. A transistor for writing is disposed on a transistor for reading, and one of its terminals is used in common with the gate electrode of a transistor for judging data. The other terminal is connected to one of the terminals of the transistor for reading.

A memory cell capable of extremely large scale integration can be obtained.

10 Claims, 7 Drawing Figures

STACKED SEMICONDUCTOR MEMORY

BACKGROUND OF THE INVENTION

This invention relates to a semiconductor memory using MOS transistors, and more particularly to a structure of a random access memory cell for dynamic operation which is suitable for large scale integration.

Two types of random access memory cell have been used for dynamic operation.

The first is the 3-transistor memory cell shown in FIG. 1, the three transistors $T_1$, $T_2$ and $T_3$ together forming one bit. The transistor $T_1$ has a write (W: write address) function, the transistor $T_3$ has a read-out (R: read address) function and the transistor $T_2$ has an amplification function. Data is stored in the form of an electric charge at the diffusion layer capacitance of $T_1$ and the gate capacitance of $T_2$. The charge can be held by periodic refreshing. The characteristic feature of this cell is that non-destructive read-out of data is possible (Din: data input, Dout: data output), and the cell itself is equipped with the amplification function. However, the most crucial problem with this cell is that the cell area is relatively great because of the 3-transistor/bit construction. Therefore, this type of cell has few commercial applications for products having a memory capacity greater than 4K bits.

In place of the cell of the kind described above, the 1-transistor/1-capacitor memory cell shown in FIG. 2 has been used for MOS DRAM having a greater memory capacity. This structure is disclosed in U.S. Pat. No. 3,387,286. A transistor T has the function of write/read-out address and the data is stored in a capacitor C. Periodic refreshing is necessary in the same way as in the cell shown in FIG. 1. Since the structure of this cell is ultimately simplified as a random access memory cell, it can be said that the cell is suitable for large scale integration. However, since read-out of the data is destructive read-out and since the cell itself is not equipped with the amplification function, the charge-storing capacitance of C must be kept above a predetermined value in order to secure a stable operation.

The main factors that determine the lower limit of charge-storing capacitance are as follows:

(1) the ratio of charge-storing capacitance to data line capacitance ($C_S/C_D$);
(2) generation of minority carrier due to the incidence of α particles; and
(3) junction leakage.

Due to these three limitations, reduction of the area of the charge-storing capacitance portion has not kept pace with the progress in the technology of processing involving very fine etching in the production of IC's; hence, miniaturization has become a serious problem.

SUMMARY OF THE INVENTION

The present invention is therefore directed to provide a random access memory cell structure which eliminates the problems of the conventional memory cell structure described above, and which is suitable for very large scale integration for the foreseeable future.

It is important that a memory cell structure suitable for very large scale integration satisfy two requirements:

(1) The cell area is equal to or smaller than that of the afore-mentioned 1-transistor/1-capacitor cell of the existing technology for fine etching.

(2) The components of the cell can be reduced as a whole, keeping pace with the progress of technology in fine etching which is expected in the future so that miniaturiazation techniques will continue to improve.

The present invention is specifically related to a theoretical feature of the 3-transistor memory cell shown in FIG. 1, said feature being that such a cell is a non-destructive read-out cell having a data amplification function; furthermore, it satisfies the two requirements described above by applying large scale integration technology in three dimensions to the 3-transistor memory cell.

FIG. 3 shows a section of the memory cell structure in accordance with the present invention. In the drawing, reference numeral 1 represents a semiconductor substrate of a first conductive type, 15 through 19 are insulating films, and 20 and 21 are interconnections. A gate electrode 13, an insulating film 14 and semiconductor regions of a second conductive type 10 and 12 together form a write address transistor $T_1$. A gate electrode 9, an insulating film 7 and semiconductor regions of the second conductive type 2 and 3 together form a read-out address transistor $T_3$. A gate electrode 12, an insulating film 8 and semiconductor regions of the second conductive type 3 and 4 together form a transistor $T_2$ having an amplification function. The data is stored in the form of an electric charge at the gate capacitance and at the junction capacitance 12 which is the semiconductor region of the second conductive type of $T_1$ and is the gate electrode of $T_2$.

This structure is characterized in that it has a three-dimensional structure in which the write address transistor $T_1$ is stacked on the read-out address transistor $T_3$ via an insulating film 16. Since a three-dimensional structure is employed, the cell planar area can be drastically reduced, and a small cell having a planar area of about 18 $\mu m^2$, for example, can be realized by a 1.3 $\mu m$ technology. This area is smaller than the 1-transistor/1-capacitor type memory cell.

The areas which is necessary for two transistors is a sufficient cell area when the cell is viewed from above. In other words, the cell area can be reduced by the difference obtained by reducing the forming area of one transistor from the area of the capacitance C in FIG. 2.

The greater the density of large scale integration, the greater becomes this effect because the capacitance C can not be reduced in proportion to the increase in the density as described earlier.

Furthermore, another great advantage is that since the transistor $T_1$ is formed in the thin film of the semiconductor on the insulating film, the holding characteristics of the memory data can be improved. As described already, the principle of operation of this cell is that the level of the potential of the region 12 is made to correspond to "1" and "0" of the data, and this logic state is detected (read out) by conduction and cut-off of the transistor $T_2$. Here, since the region 12 bearing the data is formed on the insulating film, the effect of junction leakage and the generation of minority carrier due to α particles can be remarkably reduced, and stored data is less likely to be destroyed. The reduction of junction leakage is achieved by decreasing the junction area, and the excellent resistance to α particles by the fact that the thickness of the thin film of semiconductor is sufficiently less than the range of the α particles.

As a result, this memory cell structure makes it possible to scale down the cell as a whole including the data storage portion thereby keeping pace with the progress in the technology of fine etching, readily applicable to very large scale integration in the foreseeable future.

FIG. 4 shows a circuit equivalent to the structure shown in FIG. 3. As described already, $T_1$ is formed in the thin film of semiconductor 41 (10, 11, 12) on the insulating film. This is different from the memory cell shown in FIG. 1 in that the data input-output lines are put together in a single line in order to cope with very large scale integration.

DESCRIPTION OF THE PREFERRED EMBODIMENTS

Hereinafter, preferred embodiments of the invention will be described.

Figure 1:
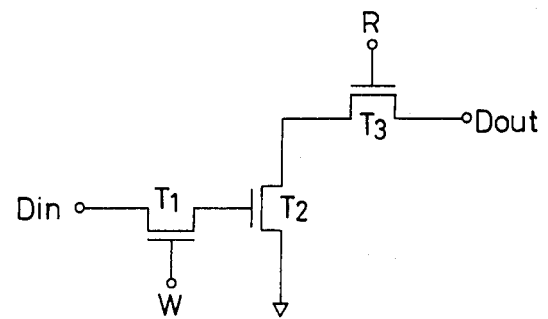
FIG. 1 is a circuit diagram showing a conventional 3-transistor memory cell.
Figure 2:
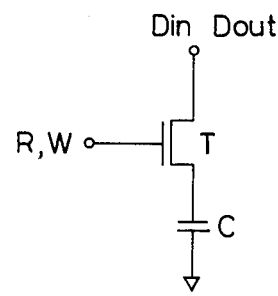
FIG. 2 is a circuit diagram showing a conventional 1-transistor/1-capacitor memory cell.
Figure 3:
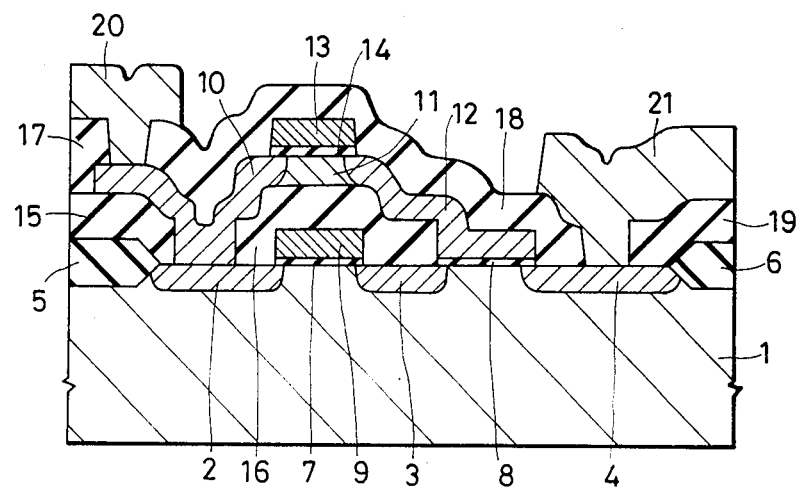
FIG. 3 is a sectional view of one embodiment of the present invention.
Figure 4:
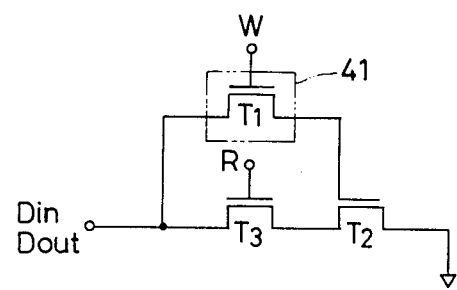
FIG. 4 is a circuit diagram of the embodiment.
Figure 5A:
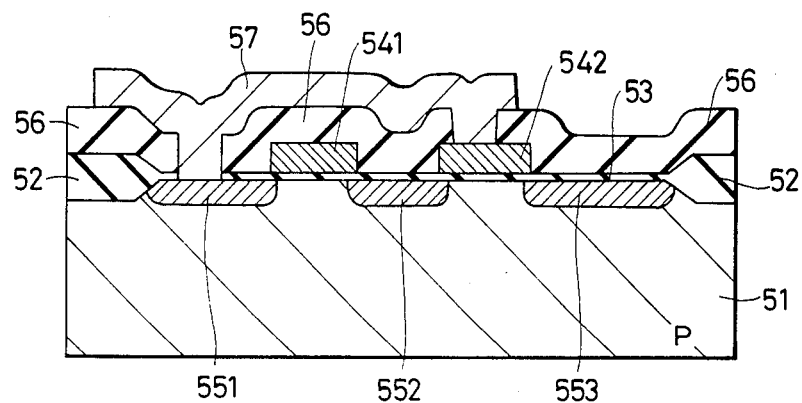
FIGS. 5A and 5B are sectional views showing the production steps of the embodiment of the present invention.
Figure 5B:
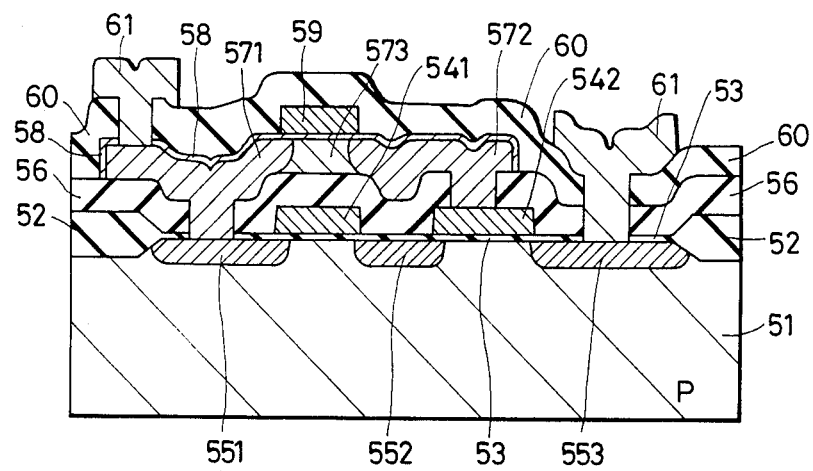

FIGS. 5A and 5B show the production steps of the memory cell structure in accordance with the present invention.

In FIGS. 5A and 5B, reference numeral 51 represents a semiconductor substrate, which is a silicon wafer having a resistivity of 10 Ohms.cm and a P-type (100) plane. A region for isolation of a thick oxide film 52 is formed on the substrate 51 by local oxidation of silicon (LOCOS), and a gate oxide film 53 is then formed in an active region. The oxide film of the region for isolation is 500 nm thick while the gate oxide film is 20 nm thick.

After boron (B) ions are implanted through the gate oxide film 53 in order to control a gate threshold voltage, a polycrystalline silicon film is deposited by chemical vapor deposition (CVD), and is then patterned to form two gate electrodes 541 and 542. Boron ion implantation is carried out at an acceleration energy of 60 KeV in a dose of $1.5 \times 10^{12}$ ions/cm$^2$. This provides a threshold voltage of about 1 V. The polycrystalline silicon film is 310 nm thick, while the gate length after patterning is 1.3 $\mu$m. Next, arsenic (As) ions are implanted using the gate electrodes 541 and 542 as the mask, thereby forming n-type dopant diffusion regions 551, 552 and 553 that serve as the source and drain of a transistor. Ion implantation is carried out at an acceleration energy of 80 KeV in a dose of $5 \times 10^{15}$ ions/cm$^2$.

A phosphosilicate glass film 56 is then deposited by CVD to form an insulating film. After contact holes are etched on the n+-type dopant diffusion region 551 and on the gate electrode 542, a polycrystalline silicon film is again deposited by CVD. The phosphosilicate glass film is 0.4 $\mu$m thick, and the polycrystalline silicon film is 0.2 $\mu$m thick. Laser light is radiated to this polycrystalline silicon film, and the film as a whole is crystallized using the contact portion with the n+-type dopant diffusion layer 551 as the seed, and is patterned to form a single crystal silicon thin film 57 that connects the n+-type dopant diffusion region 551 to the gate electrode 542.

The so-called "SOS (silicon on sapphire)" or "SOI (silicon on insulator)" is available as a method of disposing the single crystal on the insulating film. This is disclosed in U.S. Pat. No. 3,484,662.

After a gate oxide film 58 is formed on the surface of the single crystal silicon thin film 57 by thermal oxidation, boron (B) ions are implanted to control the threshold voltage of a transistor to be formed in the silicon thin film 57. The gate oxide film is 20 nm thick. Ion implantation is carried out at an acceleration energy of 60 KeV at a dosage of $1.5 \times 10^{12}$ ions/cm$^2$. This provides a threshold voltage of about 1 V. Thereafter, polycrystalline silicon film is deposited by CVD, and is patterned to form a gate electrode 59. Arsenic (As) ions are implanted using the gate electrode 59 as the mask to form n+-type dopant diffusion regions 571 and 572 that serve as the source and drain. The polycrystalline silicon film is 310 nm thick, and the gate length after patterning is 1.3 $\mu$m. Arsenic ion implantation is carried out at an implantation enregy of 80 KeV at a dosage of $5 \times 10^{15}$ ions/cm$^2$.

Finally, high temperature annealing is carried out in an N$_2$ ambient atmosphere to activate the ions that have been introduced by ion implantation. Thereafter, an insulating film consisting of phosphosilicate glass 60, contact holes and Al interconnections 61 are formed to complete the production process. High temperature annealing in the N$_2$ ambient atmosphere is carried out at 950° C. for 30 minutes. As a result, the junction depth of the n+-type dopant diffusion regions is about 0.25 $\mu$m and is greater than the thickness 0.2 $\mu$m of the single crystal silicon film 57, so that the junction area participating in the junction leak of the n+-type dopant diffusion region 572 can be remarkably reduced.

When the memory cell of a 1.3 $\mu$m gate of this embodiment, production steps for which have been described above, are integrated in a 1K bit array and are subjected to an operation test, it has been confirmed that the operating voltage is within the range of from 2.5 V to 7.0 V, the production yield is high and the array operates stably. When the data holding time is evaluated, excellent refresh characteristics such as shown in FIG. 6 can be obtained.

Figure 6:
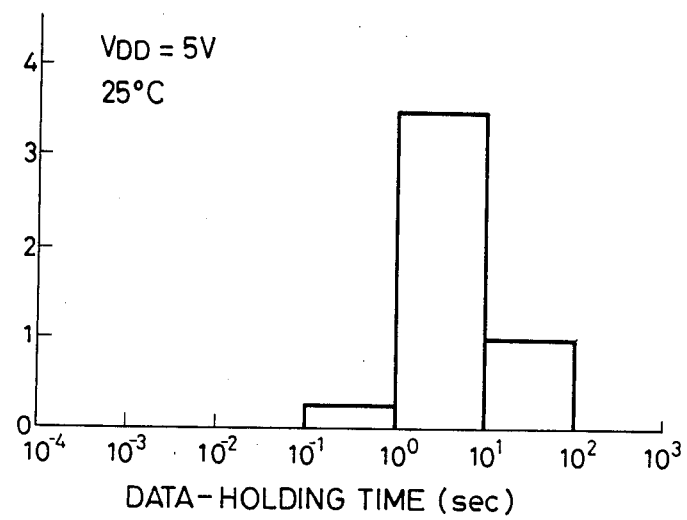
FIG. 6 is a diagram showing the refresh characteristics of the memory cell in accordance with the present invention.

FIG. 6 is a histogram of the data holding time. The operation conditions for a data holding time of at least $10^{-1}$ second are a power source voltage of 5 V and an ambient temperature of 25° C., the characteristics being favorably comparable to those of prior art cells.

As described above, the present invention can realize a random access memory cell structure having a cell area smaller than that of a 1-transistor/1-capacitor type memory cell, which is free, in principle, from any problem when further miniaturizing the memory cell as a whole with the future progress of technology for fine etching, and which is suitable for very large scale integration. A 16M-bit memory chip will become available if technology of a 0.5 $\mu$m level can be employed.

What is claimed is:

1. A semiconductor memory comprising:
    a first transistor for writing, said first transistor having a gate electrode, and source and drain regions;
    a second transistor for amplifying, said second transistor having a gate electrode, and source and drain regions; and
    a third transistor for reading, said third transistor having a gate electrode, and source and drain regions, wherein said drain or source of said first transistor is connected to said gate electrode of said second transistor, wherein said drain or source of said second transistor is connected to said source or drain of said third transistor, and wherein at least a part of said first transistor is stacked on said third transistor in such a manner that an insulating film is formed on said gate electrode of said third transistor and said first transistor is stacked over said insulating layer.

2. A semiconductor memory as set forth in claim 1, wherein said drain or source of said first transistor is connected to said gate electrode of said second transistor by a semiconductor layer disposed by the same production step of forming the gate electrode and the drain or source region.

3. A semiconductor memory as set forth in claim 1, wherein said gate electrode of said second transistor and said gate electrode of said third transistor are disposed by the same production step.

4. A semiconductor memory as set forth in claim 2, wherein a region formed by connecting the source or drain of said first transistor to said source or drain of said third transistor is used as a data input/output portion, and said source of drain of said second transistor is connected to a reference potential.

5. A semiconductor memory as set forth in claim 3, wherein a region formed by connecting the source or drain of said first transistor to said source or drain of said third transistor is used as a data input/output portion, and the source or drain of said second transistor is connected to a reference potential.

6. A semiconductor memory including:
   a semiconductor substrate;
   a first region used as a source region or a drain region, a second region used as a drain region and a source region, and a third region used as a drain region or a source region on one major surface of said substrate;
   a first insulating film formed on said surface of said substrate between at least said first and second regions;
   a first electrode formed on said first insulating film;
   a second insulating film formed on said surface of said substrate between at least said second region and said third region;
   a second electrode formed on said second insulating film;
   a third insulating film formed on said first electrode and extending from an area above said first region to an area above said second region;
   a semiconductor layer formed over said third insulating film, one edge of said semiconductor layer electrically being connected to said first region and the other edge of said semiconductor layer electrically being connected to said second electrode;
   a fourth insulating film formed on a part of said semiconductor layer; and
   a third electrode formed on said fourth insulating film.

7. A semiconductor memory as set forth in claim 6, wherein said second electrode and said semiconductor layer are disposed by the same production step and are a continuous layer.

8. A semiconductor memory as set forth in claim 6, wherein said first insulating film and said second insulating film are a continuous insulating film over said second region.

9. A semiconductor memory as set forth in claim 6, wherein said first electrode and said second electrode are disposed by the same production step.

10. A semiconductor memory as set forth in claim 6, wherein said first region, said second region, said first insulating film and said first electrode form a reading transistor of a three-transistor memory cell, wherein said second region, said third region, said second insulating film and said second electrode form an amplifying transistor of said three-transistor memory cell and wherein said semiconductor layer includes regions to form a source and a drain separated from one another by a portion of said semiconductor layer formed under said fourth insulating layer so that said source and drain regions of said semiconductor layer, said fourth insulating film and said third electrode form a writing transistor of said three-transistor memory cell.

* * * * *